United States Patent [19]

Enomoto et al.

[11] Patent Number: 5,589,255
[45] Date of Patent: Dec. 31, 1996

[54] ADHESIVE FOR ELECTROLESS PLATING, PRINTED CIRCUIT BOARDS AND METHOD OF PRODUCING THE SAME

[75] Inventors: Ryo Enomoto; Motoo Asai, both of Ogaki, Japan

[73] Assignee: Ibiden Co., Ltd., Gifu, Japan

[21] Appl. No.: 253,582

[22] Filed: Jun. 3, 1994

Related U.S. Application Data

[63] Continuation of Ser. No. 41,874, Apr. 2, 1993, abandoned, which is a continuation of Ser. No. 692,729, Apr. 29, 1991, abandoned, which is a division of Ser. No. 344,968, Apr. 28, 1989, Pat. No. 5,055,321.

[30] Foreign Application Priority Data

Apr. 28, 1988 [JP] Japan .................................. 63-104044
May 30, 1988 [JP] Japan .................................. 63-130253
May 30, 1988 [JP] Japan .................................. 63-130254

[51] Int. Cl.⁶ ...................................................... C09J 7/02
[52] U.S. Cl. .......................... 428/261; 428/356; 523/427; 523/428; 525/396; 525/407
[58] Field of Search .................... 523/427, 428; 525/396, 407; 427/98, 96, 306; 428/261, 355

[56] References Cited

U.S. PATENT DOCUMENTS

| | | | |
|---|---|---|---|
| 3,356,624 | 12/1967 | Neal et al. ....................... | 523/427 X |
| 3,672,937 | 6/1972 | Kallrath ........................... | 427/98 X |
| 3,686,017 | 8/1972 | Menikheim et al. ............. | 427/98 X |
| 4,152,477 | 5/1979 | Haruta et al. ................... | 428/209 |
| 4,216,246 | 8/1980 | Iwasaki et al. .................. | 430/275 X |
| 4,365,043 | 12/1982 | Konishi et al. .................. | 525/113 |
| 4,448,836 | 5/1984 | Gätzschmann et al. ......... | 428/164 |
| 4,457,951 | 7/1984 | D'Amico et al. ................. | 427/96 |
| 4,457,952 | 7/1984 | Kawamoto et al. .............. | 427/98 |
| 4,501,853 | 2/1985 | Sugimori et al. . | |
| 4,504,607 | 3/1985 | Leech ............................... | 523/427 |
| 4,510,276 | 4/1985 | Leech et al. ..................... | 523/427 |
| 4,524,181 | 6/1985 | Adam et al. ...................... | 525/107 |
| 4,552,626 | 11/1985 | Stevenson ........................ | 204/20 |
| 4,642,161 | 2/1987 | Akohoshi et al. ................ | 156/630 |
| 4,643,798 | 2/1987 | Takada et al. .................... | 156/630 |
| 4,707,394 | 11/1987 | Chant ............................... | 428/209 |
| 4,740,657 | 4/1988 | Tsukagoshi et al. . | |
| 4,752,499 | 6/1988 | Enomoto . | |
| 5,021,472 | 6/1991 | Enomoto . | |
| 5,049,596 | 9/1991 | Fujimoto et al. ................. | 523/427 |
| 5,055,321 | 10/1991 | Enomoto et al. ................. | 427/96 X |

FOREIGN PATENT DOCUMENTS

| | | |
|---|---|---|
| 3237986 | 6/1983 | Germany . |
| 4929458 | 3/1974 | Japan . |
| 53-140344 | 12/1978 | Japan . |
| 61-276875 | 12/1986 | Japan . |
| 63-126297 | 5/1988 | Japan . |

OTHER PUBLICATIONS

"Surface", vol. 25, No. 1, 1987, pp. 1–19, 70 & sheet of photographs.
German Office Action in German and English dated Feb. 19, 1996.
Japanese communication in Japanese and English dated Feb. 20, 1996.
English Language Abstract of JP 53-140344.
English Language Abstract of JP 61-276875.
Jap. Pat. Abst. J 63-126,297 A.

Primary Examiner—Jenna Davis
Attorney, Agent, or Firm—Greenblum & Bernstein P.L.C.

[57] ABSTRACT

An adhesive for electroless plating is formed by dispersing particular heat-resistant granules easily soluble in an oxidizing agent into a particular heat-resistant resin sparingly soluble in the oxidizing agent through a curing treatment. A printed circuit board is manufactured by using such an adhesive.

11 Claims, 5 Drawing Sheets

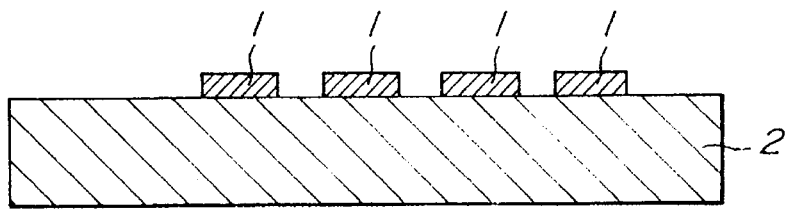
FIG_1a
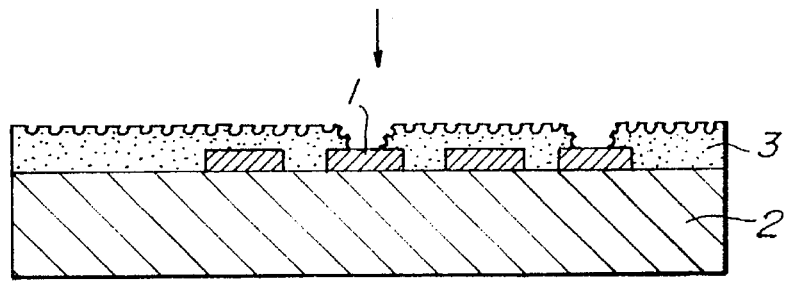
FIG_1b
FIG_1e
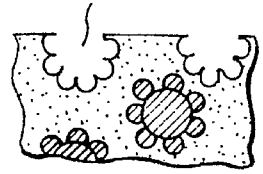
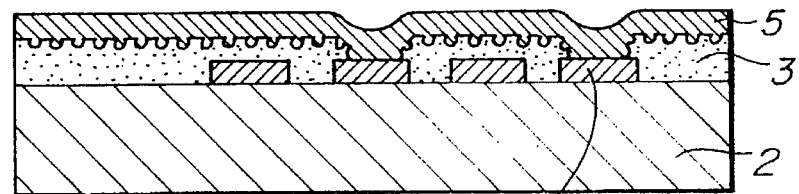
FIG_1c
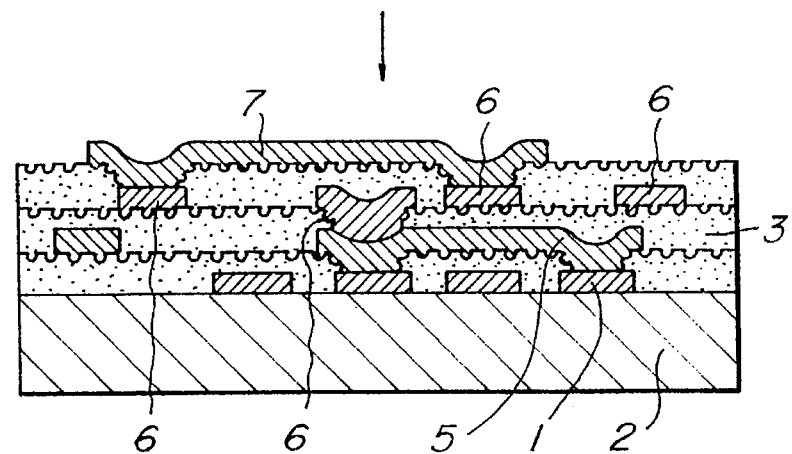
FIG_1d

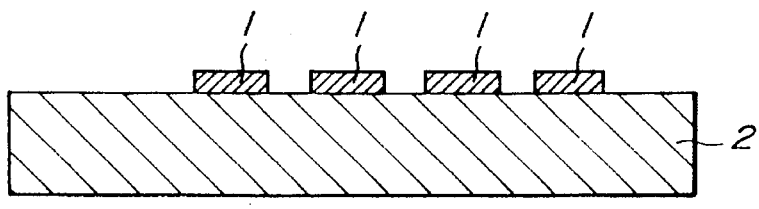
FIG._2a
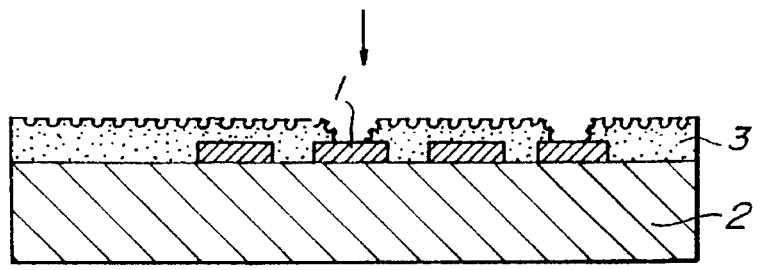
FIG._2b
FIG. 2e
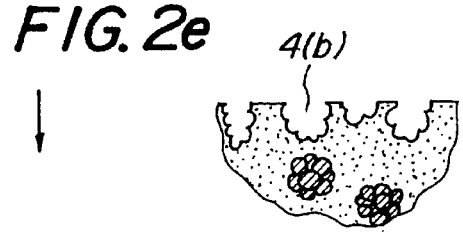
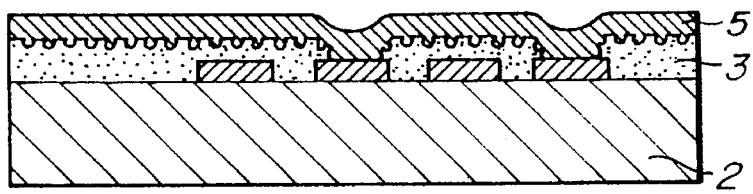
FIG._2c
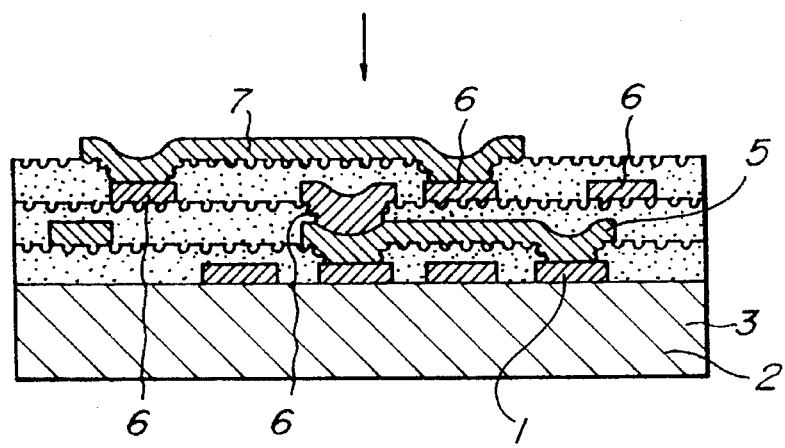
FIG._2d

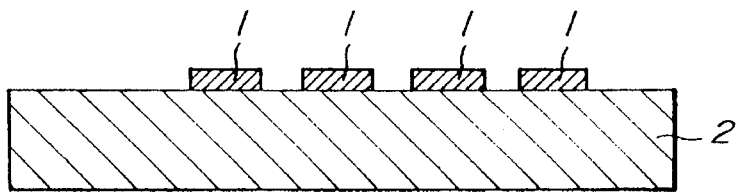
FIG. 3a
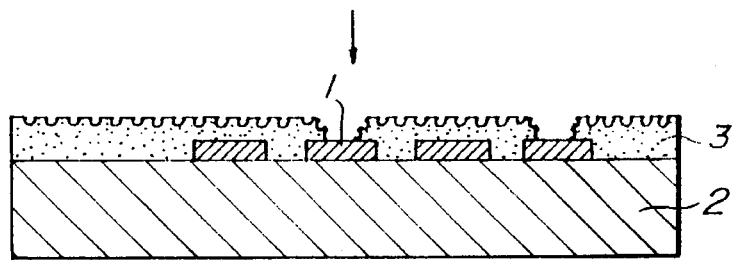
FIG. 3b
FIG. 3e
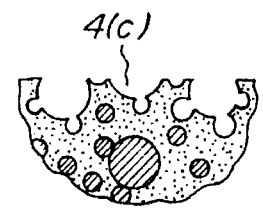
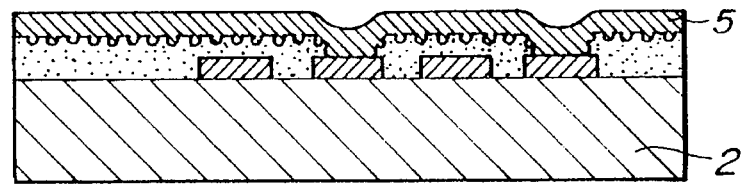
FIG. 3c
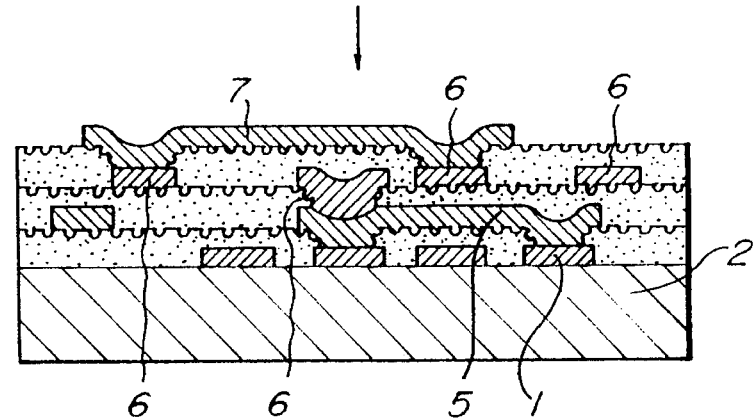
FIG. 3d

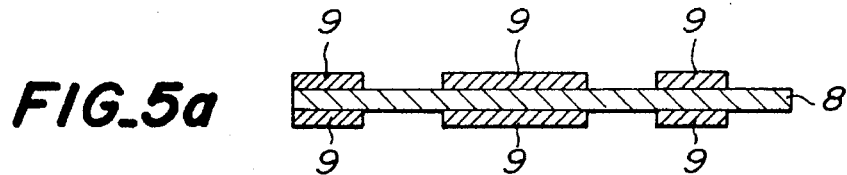
FIG._5a
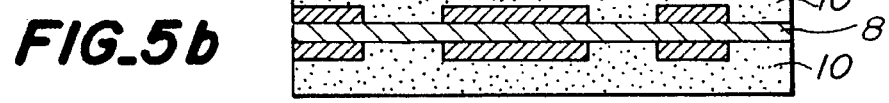
FIG._5b
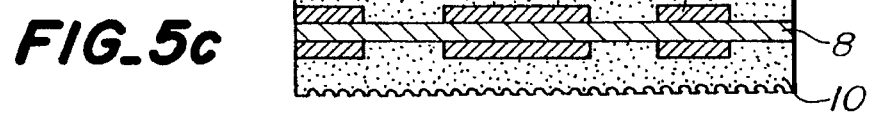
FIG._5c
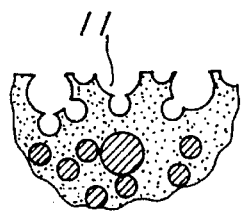
FIG._5g
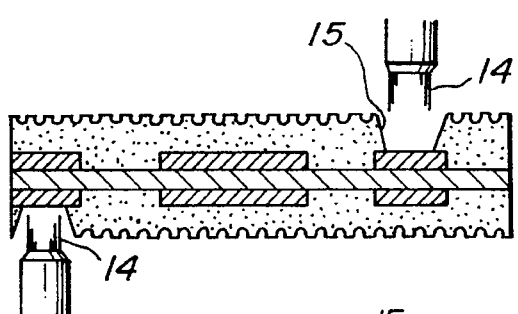
FIG._5d
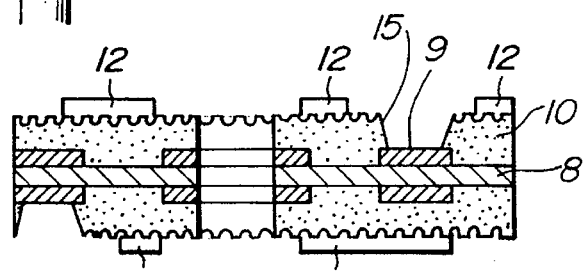
FIG._5e
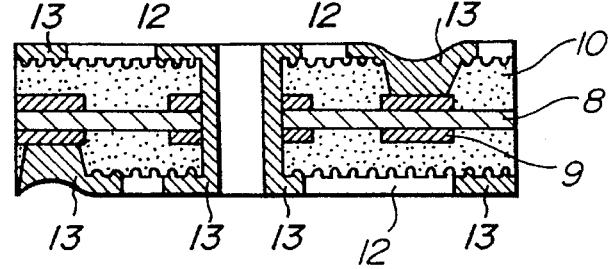
FIG._5f

ADHESIVE FOR ELECTROLESS PLATING, PRINTED CIRCUIT BOARDS AND METHOD OF PRODUCING THE SAME

This application is a continuation of application Ser. No. 08/041,874, filed Apr. 2, 1993, now abandoned, which is a continuation of application Ser. No. 07/692,729, filed Apr. 29, 1991, now abandoned, which is a divisional of application Ser. No. 07/344,968, filed Apr. 28, 1989, which issued as U.S. Pat. No. 5,055,321 on Oct. 8, 1991.

BACKGROUND OF THE INVENTION

1. Field of the Invention

This invention relates to an adhesive for electroless plating having excellent thermal resistance, electrical insulation resistance, chemical stability and adhesion property to electroless plated film as well as a printed circuit board using such an adhesive and a method of producing the same.

2. Related Art Statement

Recently, the advancement of electronics is remarkable, and as a result it is attempted to further miniaturize electronic equipment and achieve high speed access of the function. For this purpose, printed circuit boards, particularly printed circuit boards provided with parts such as IC, LSI and the like, are required to have high densification and reliability through fine patterns.

Heretofore, there is typically employed an etched foil method wherein a copper foil is laminated onto a substrate and then etched, as a method of forming a conductor circuit on the printed circuit board. According to this method, the conductor circuit having an improved adhesion property to the substrate can be formed, but since the copper foil is thick, it is difficult to obtain a fine pattern of high accuracy by the etching, and also there are further problems that the production steps are complicated, and the efficiency is bad, and the like.

Lately, therefore, there is proposed an additive method wherein an adhesive layer is formed on the surface of the substrate. The surface of the adhesive layer then toughened and subjected to electroless plating to form a conductor circuit as the method of forming the conductor circuit on the printed circuit board.

As the adhesive used in this additive method, there are known an adhesive containing diene series synthetic rubber, an adhesive disclosed in U.S. Pat. No. 4,216,246 and the like. However, the former adhesive containing the synthetic rubber has drawbacks that the adhesion strength becomes much lower at high temperatures, and the electroless plated film swells during soldering, and the like. Further, the thermal resistance is low and electric properties, such as surface resistance and the like, are insufficient, so that the use region is fairly restricted. On the other hand, in the adhesive as disclosed in U.S. Pat. No. 4,216,246, a thermosetting resin component constituting the spherical granule for the formation an anchor in the adhesive is not etched, and such spherical granule for the formation the anchor is simultaneously cured together with a heat-resistant resin as a matrix, so that it is difficult to control the shape and size of the granule. Further, the toughened surface of the adhesive layer formed on the substrate of a relatively uneven roughness, so that it is also difficult to obtain a conductor circuit of fine pattern.

Lately, printed circuit boards in which wiring circuits are formed at a multilayer state have been used for high densification in the printed circuit board.

As the printed circuit board having the multilayered wiring circuits, there has hitherto been used a printed circuit board obtained, for example, by laminating plural circuit plates, each provided with an internal circuit pattern, one upon the other through a prepreg as an insulating layer, pressing them, forming a through-hole therein and then connecting and electrically conducting the internal circuit patterns to each other through the through-hole.

In the aforementioned printed circuit board, however, plural internal circuit patterns are connected and electrically conducted to each other through the through-holes formed therein, so that it is difficult to realize high densification or high speed access by the formation of a complicated wiring circuit pattern.

As a printed circuit board capable of overcoming the above difficulty, there has been developed progressed to develop printed circuit boards wherein conductor circuits and organic insulating films are alternately built up on each other. Such a printed circuit board is suitable for extra-high densification and high speed access, but it is difficult to form an electroless plated film onto the organic insulating film with a good reliablity. In this printed circuit board, therefore, the conductor circuit is formed by PVD process such as vapor deposition, sputtering and the like, or by using electroless plating together with the above PVD process. However, the method of forming a conductor circuit through the PVD process is poor in productivity and undesirably high in cost.

The inventors have made various studies for solving the drawbacks in the adhesive for electroless plating and the printed circuit board as mentioned above, and have already proposed solutions in U.S. Pat. No. 4,752,499 and Japanese Patent laid open No. 63-126,297.

However, the above proposed technique still has a problem that when there is no great difference in the solubility to a particular chemical between the particulate substance and the matrix resin, the resulting anchor is apt to become unclear, and consequently the adhesion property of the plated film is not improved.

SUMMARY OF THE INVENTION

It is an object of the invention to solve the aforementioned drawbacks in the adhesive for electroless plating as previously proposed by the inventors as well as problems included in the heat-resistant resin particles for the formation of anchor, and to provide an adhesive for electroless plating having excellent thermal resistance, electrical resistance, chemical stability and adhesion property to electroless plated film, as well as a printed circuit board using such an adhesive and a method of producing the printed circuit board.

The inventors have made further studies for improving the technique previously proposed by the inventors, and have found that the aforementioned problems can advantageously be solved by using an adhesive for electroless plating which is obtained by dispersing a mixture of heat-resistant resin particles and heat-resistant resin fine powder, quasi-particles obtained by adhering at least one of heat-resistant resin fine powder and inorganic fine powder to surfaces of heat-resistant resin particles, or agglomerate granules of heat-resistant resin fine powder into a heat-resistant resin having a sparingly soluble property to an oxidizing agent through a curing treatment, and as a result the invention has been accomplished.

According to a first aspect of the invention, there is the provision of an adhesive for electroless plating, characterized in that at least one heat-resistant particle easily soluble in an oxidizing agent, which is selected from the group consisting of a mixture of heat-resistant resin particles having an average particle size of 2–10 μm and heat-resistant resin fine powder having an average particle size of not more than 2 μm, quasi-particles obtained by adhering at least one of heat-resistant resin fine powder having an average particle size of not more than 2 μm and inorganic fine powder having an average particle size of not more than 2 μm to surfaces of heat-resistant particles having an average particle size of 2–10 μm and agglomerate particles obtained by agglomerating heat-resistant resin fine powder having an average particle size of not more than 2 μm into an average particle size of 2–10 μm, is dispersed into a heat-resistant resin exhibiting a sparingly soluble property to an oxidizing agent through a curing treatment.

According to a second aspect of the invention, there is the provision of a printed circuit board obtained by forming electroless plated conductor circuit pattern onto an adhesive layer made from a heat-resistant resin, wherein the adhesive layer is an adhesive layer made from the adhesive for electroless plating as mentioned above. Further, recesses for the formation an anchor on said electroless plated film, which are formed by dissolving out and removing portions of the heat-resistant particles through a treatment with an oxidizing agent, are formed on the surface of said adhesive layer forming the electroless plated film thereon.

A third aspect of the invention lies in a method of producing such a printed circuit board.

BRIEF DESCRIPTION OF THE DRAWINGS

The invention will be described with reference to the accompanying drawings, wherein:

FIGS. 1a, 1b, 1c, 1d and 1e are partly sectional views illustrating production steps for the formation of the printed circuit board provided with a multilayered conductor circuit pattern according to Example 1;

FIGS. 2a, 2b, 2c, 2d and 2e are partly sectional views illustrating production steps for the formation of the printed circuit board provided with a multilayered conductor circuit pattern according to Example 2;

FIGS. 3a, 3b, 3c, 3d and 3e are partly sectional views illustrating production steps for the formation of the printed circuit board provided with a multilayered conductor circuit pattern according to Example 3;

FIGS. 5a, 5b, 5c, 5d, 5e, 5f and 5g are partly sectional views illustrating production steps for the formation of the printed circuit board provided with a multilayered conductor circuit pattern according to Example 5.

DESCRIPTION OF THE PREFERRED EMBODIMENTS

Figure 4A:
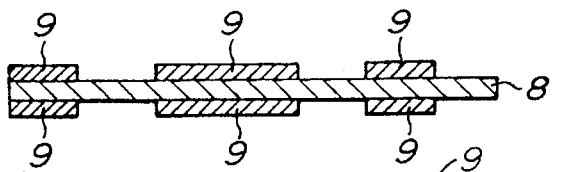
FIGS. 4a, 4b, 4c, 4d, 4e, 4f and 4g are partly sectional views illustrating production steps for the formation of the printed circuit board provided with a multilayered conductor circuit pattern according to Example 4.

The adhesive for electroless plating according to the invention comprises at least one heat-resistant particle easily soluble in an oxidizing agent, which is selected from a mixture of heat-resistant resin particles having an average particle size of 2–10 μm and heat-resistant resin fine powder having an average particle size of not more than 2 μm, quasi-particles of heat-resistant resin fine powder having an average particle size of not more than 2 μm or inorganic fine powder having an average particle size of not more than 2 μm adhered to surfaces of heat-resistant resin particles having an average particle size of 2–10 μm, and agglomerate particles having an average particle size of 2–10 μm and made from heat-resistant resin fine powder having an average particle size of not more than 2 μm, and a heat-resistant resin dispersing the above heat-resistant particle thereinto and having a sparingly soluble property to the oxidizing agent through a curing treatment.

That is, the adhesive for electroless plating according to the invention is an adhesive obtained by dispersing heat-resistant particles easily soluble in the oxidizing agent into the heat-resistant resin sparingly soluble in the oxidizing agent by the curing treatment. When such an adhesive for electroless plating is applied to a substrate and dried and cured or a film of the adhesive or a prepreg of the adhesive impregnated into a fabric or the like is adhered to the substrate, an adhesive layer is formed at a state that the heat-resistant resin particles are uniformly dispersed into a heat-resistant resin forming a matrix (hereinafter referred to as matrix heat-resistant resin).

Therefore, when such an adhesive layer is treated with the oxidizing agent, the heat-resistant particles dispersing onto the surface portion of the adhesive layer are mainly dissolved and removed to uniformly roughen the surface of the adhesive layer because there is a great difference in the solubility to the oxidizing agent between the heat-resistant particle and the matrix heat-resistant resin. As a result, a clear anchor can be formed at the interface between the adhesive layer and the electroless plated film, whereby high adhesion strength and reliability can be obtained.

The reason why the heat-resistant particles used in the invention is limited to at least one selected from a mixture of heat-resistant resin particles having an average particle size of 2–10 μm and heat-resistant resin fine powder having an average particle size of not more than 2 μm, quasi-particles of heat-resistant resin fine powder having an average particle size of not more than 2 μm or inorganic fine powder having an average particle size of not more than 2 μm adhered to surfaces of heat-resistant resin particles having an average particle size of 2–10 μm, and agglomerate particles having an average particle size of 2–10 μm m and made from heat-resistant resin fine powder having an average particle size of not more than 2 μm is due to the fact that anchors of very complicated shape can be formed by using these particles or the mixture as the heat-resistant particle. Particularly, the use of the above mixture as the heat-resistant particle is preferable.

The reason why the size of the heat-resistant resin particle in the false particles, agglomerate particles or mixture as the heat-resistant particle is 2–10 μm on average is due to the following facts. That is, when the average particle size is more than 10 μm, the density of anchors formed by dissolution and removal through the oxidizing treatment is small and is apt to become ununiform and consequently the adhesion strength of the plated film is degraded to lower the reliability of the product, and further the unevenness of the surface of the adhesive layer is extremely violent and it is difficult to obtain fine conductor pattern and also the mounting of parts is apt to be inconvenient. On the other hand, when the average particle size is less than 2 μm, the anchor is apt to become unclear. The average particle size is preferable within a range of 3–8 μm.

Furthermore, the reason why the size of the adhered fine powder in the quasi-particles, the heat-resistant resin fine powder consituting the agglomerate particle or the heat-resistant resin fine powder in the mixture is limited to not more than 2 μm on average is due to the fact that when the average particle size is more than 2 μm, the anchor effect lowers and the adhesion strength of the plated film is poor. The average particle size is preferably not more than 0.8 μm.

Furthermore, the particle size of the heat-resistant resin particle in the quasi-particles, agglomerate particles or mixture is advantageous to be not less than 2 times of the particle size of the adhered fine powder in the quasi-particles or the heat-resistant resin fine powder in the agglomerate particles or the mixture.

The resin constituting the heat-resistant particles is advantageous to be excellent in the thermal resistance and the electrical insulating property, stable against chemicals other than the oxidizing agent, insoluble in the heat-resistant resin liquid or solvent through the curing treatment but easily soluble in the oxidizing agent. As the oxidizing agent, use may be made of chromic acid, chromate, permanganate, ozone and the like. As the resin constituting the heat-resistant particles, use may be made of at least one resin selected from epoxy resins, polyester resins and bismaleimide-triazine resin and the like. Among these resins, the epoxy resin is most preferable because of excellent properties. As the inorganic fine powder easily soluble in the oxidizing agent, calcium carbonate may be used.

The mixture of heat-resistant resin particle having an average particle size of 2–10 μm and heat-resistant resin fine powder having an average particle size of not more than 2 μm renders the anchor to be formed into a very complicated shape, so that the amount of the heat-resistant resin fine powder having an average particle size of not more than 2 μm is preferable to be 50–85% by weight.

The heat-resistant resin forming the matrix will be described below.

Such a resin is favorable to be a photo-sensitive resin, and is excellent in thermal resistance, electrical insulating property, chemical stability and adhesion property and sparingly soluble in the oxidizing agent through the curing treatment. For example, the resin is at least one resin selected from epoxy resin, epoxy-modified polyimide resin, polyimide resin, phenolic resin and the like.

The reason why the use of photo-sensitive resin is preferable as the heat-resistant resin forming matrix is due to the fact that via holes for connecting conductor layers to each other can easily be formed by developing and etching after the exposure at given places.

Even if the resin constituting the heat-resistant particles is the same kind as the heat-resistant resin forming the matrix, when the difference in the solubility to the oxidizing agent is different between both the resins, the effect of the invention can be developed.

The compounding amount of the heat-resistant particle to the heat-resistant resin forming the matrix is advantageous to be 2–350 parts by weight per 100 parts by weight of the heat-resistant resin forming the matrix. Particularly, the amount is preferable to be 5–200 parts by weight from a viewpoint that the adhesion strength between the adhesive layer and the electroless plated film is increased. When the amount of the heat-resistant particles is less than 2 parts by weight, the density of the anchor formed by dissolution and removal means is low and the sufficient adhesion property between the adhesive layer and the electroless plated film is not obtained, while when it is more than 350 parts by weight, the surface of the adhesive layer is substantially dissolved and removed, so that it is difficult to form clear anchors.

The printed circuit board according to the invention will be described below.

The printed circuit board according to the invention is comprised by forming conductor circuit patterns obtained through electroless plating, or through electroless plating and electro-plating onto the adhesive layer composed of the heat-resistant resin.

The reason why the conductor circuit pattern is the electroless plated film is due to the fact that the formation of conductor circuit pattern through electroless plating is easy in the mass production and suitable for high density wiring.

Furthermore, the multilayer printed circuit board can be manufactured by laminating the conductor circuits through the adhesive layer or an electrical insulation layer. In this case, the adhesive layer composed of the heat-resistant resin has a low dielectric constant, is easy to form into a thick film, and is suitable for the high speed formation.

Next, the method of producing the printed circuit board according to the invention will be described in detail.

According to the invention, the adhesive layer for electroless plating is first formed on the substrate.

As the method of forming the adhesive layer for electrode plating on the substrate, there may be adapted a method wherein a mixture obtained by dispersing heat-resistant particles easily soluble in an oxidizing agent into an uncured light-sensitive resin sparingly soluble in an oxidizing agent after the curing treatment is applied to the substrate, a method wherein a film made from the above mixture or a prepreg obtained by impregnating the mixture into a fibrous material is adhered to the substrate, and the like. As the application method, there may be used various methods such as roller coating, dip coating, spray coating, spinner coating, cartain coating, screen printing and so on. Moreover, the heat-resistant resin being sparingly soluble in the oxidizing agent through the curing treatment of the film or prepreg is one dried up to B-stage.

The heat-resistant resin constituting the heat-resistant particles easily soluble in the oxidizing agent is comprised of resin subjected to the curing treatment. Because, when using the uncured resin, if it is added to a heat-resistant resin liquid forming the matrix or a solution of a heat-resistant resin forming a matrix in a solvent, the heat-resistant resin constituting the heat-resistant particles is dissolved in the heat-resistant resin liquid or the solution, so that the function as the heat-resistant particle can not be developed.

The particles or fine powder of the heat-resistant resin constituting the heat-resistant particle are produced by pulverizing in a jet mill or a freezing dryer after the thermosetting of the heat-resistant resin, by spray drying the heat-resistant resin solution and then curing, or by adding an aqueous solution of a curing agent to an emulsion of uncured heat-resistant resin, stirring and seiving through an air siever or the like.

As the method of curing the heat-resistant resin constituting the heat-resistant particle, there utilized a method of curing by heating, a method of adding a catalyst for curing, and the like. Among them, the heat curing method is practical.

As a method of forming quasi-particles by adhering at least one of heat-resistant resin fine powder and inorganic fine powder to the surface of the heat-resistant resin particle, it is advantageous to use a method wherein the surfaces of the heat-resistant resin particles are covered with the heat-resistant resin fine powder or the inorganic fine powder and then heated to fuse them to each other or adhered through a binder.

As a method of forming agglomerate particles, the heat-resistant resin fine powder is merely heated in a hot dryer or the like, or added with a binder and mixed and dried, whereby the powder is agglomerated. Then, the agglomerated powder is pulverized by means of a ball mill, a ultrasonic dispersing machine or the like, and then sieved through an air siever or the like.

The thus obtained heat-resistant particles have not only a spherical shape but also various complicated shapes. Therefore, the shape of the anchor made from these particles has a complicated shape in accordance with the shape of the particle, which effectively acts to enhance the adhesion strengths of the plated film such as peeling strength, pulling strength and the like.

The aforementioned heat-resistant particles are added to the heat-resistant resin liquid forming the matrix or the solution of the matrix forming heat-resistant resin in a solvent and uniformly dispersed thereinto to obtain a mixed solution.

As the heat-resistant resin liquid to be added with the heat-resistant particles, the heat-resistant resin liquid itself containing no solvent may be used, but the solution of the heat-resistant resin into the solvent is preferably used because the latter solution is low in the viscosity and uniformly disperses the heat-resistant particles. Such a heat-resistant resin solution is advantageously applied to the substrate or impregnated into a substrate. As the solvent used for dissolving the heat-resistant resin, mention may be made of usually used solvents such as methyl ethyl ketone, methyl cellosolve, ethyl cellosolve, butyl carbitol, butyl cellulose, tetraline, dimethyl formaldehyde, n-methyl pyrrolidone and the like.

The thickness of the adhesive layer according to the invention is usually about 20–100 μm, but when the high insulating property is required, the thickness may be more than the above value.

Moreover, via holes may be formed in the adhesive layer for connecting the conductor circuits to each other. As the method for the formation of via holes, it is preferable that the light-sensitive resin is used as the heat-resistant resin forming the matrix and exposed to a light at given positions and then developed and etched. Further, the formation of via holes through laser working may be adapted. In the latter case, the laser working may be carried out before or after the surface roughening of the adhesive layer.

As the substrate used in the invention, use may be made of plastic substrate, ceramic substrate, metal substrate, film substrate and the like, an example of which includes glass epoxy substrate, glass polyimide substrate, alumina substrate, low temperature fired ceramic substrate, aluminum nitride substrate, aluminum substrate, iron substrate, polyimide film substrate and so on.

Then, the heat-resistant particles existent on the surface portion of the adhesive layer are dissolved in the oxidizing agent and removed therefrom. In this case, the substrate provided with the adhesive layer is immersed in the solution of the oxidizing agent, or the oxidizing agent is sprayed onto the surface of the adhesive layer, whereby the surface of the adhesive layer is roughened. Moreover, it is advantageous that the surface portion of the adhesive layer is previously and lightly polished or liquid-honed with a fine abrasive powder for effectively dissolving and removing the heat-resistant particles.

According to the invention, the conductor layer is formed through electroless plating after the surface roughening of the adhesive layer. As the electroless plating, there are, for example, electroless copper plating, electroless nickel plating, electroless tin plating, electroless gold plating, electroless silver plating and the like. Among them, at least one of electroless copper plating, electroless nickel plating and electroless gold plating is preferable. Moreover, after the electroless plating, a different electroless plating or electrolytic plating may be conducted, or a soldering may be applied onto the electroless plated film.

According to the invention, the conductor circuit pattern can be formed by the conventionally known methods for the printed circuit board. For example, a method of subjecting the substrate to an electroless plating and then etching the circuit pattern, a method of directly forming the circuit pattern during the non-electrolytic plating and the like may be applied.

The invention will be described with reference to examples for producing printed circuit boards by using the adhesive for electroless plating according to the invention.

EXAMPLE 1

(1) As shown in FIG. 1a, a photo-sensitive dry film (made by DuPont, trade name: Liston 1015) was laminated onto a glass epoxy copper laminated plate 2 (made by Toshiba Chemicals, trade name: Toshiba Tecolite MEL-4), and then an ultraviolet ray was irradiated thereto through a mask film drawing a desired conductor circuit pattern. Thereafter, the pattern was developed with 1,1,1-trichloroethane and copper of nonconductor portion was removed with an etching solution of cupric chloride and further the dry film was peeled off with methylene chloride. Thus, a printed board having a first conductor layer 1 of plural circuit pattern was obtained.

(2) Into a suspension of 200 g of epoxy resin particles (made by Toray, Toraypeal EP-B, average particle size: 3.9 micrometers) dispersed in 500 liters of acetone was added dropwise a suspension of 300 g of epoxy resin powder (made by Toray, Toraypeal EP-B, average particle size: 0.5 micrometers) dispersed in an acetone solution containing epoxy resin (made by Mitsui Toatsu Chemicals, trade name: TA-1800) in an amount of 30 g per 1 liter of acetone with stirring in a Henshell mixer (made by Mistui Miike Seisakusho, FM10B model), whereby the epoxy resin powder was adhered to the surfaces of the epoxy resin particles. After the removal of acetone, the mixture was heated at 150° C. to form quasi-particles. The quasi-particles had an average particle size of about 4.3 micrometers, wherein about 75% by weight of the false particles was existent within ±2 micrometers of the above average particle size.

(3) Sixty parts by weight of 50% acrylated cresol novolak type epoxy resin (made by Yuka Shell, trade name: Epikote 180S), 40 parts by weight of bisphenol A type epoxy resin (made by Yuka Shell, trade name: Epikote 1001) 15 parts by weight of diallyl terephthalate, 4 parts by weight of 2-methyl-1-[4-(methylthio) phenyl]-2-morpholinopropane-1 (made by Ciba Geigy, trade name: Irugacure 907), 4 parts by weight of imidazole (made by Shikoku Kasei, trade name: 2P4MHZ) and 50 parts by weight of the false particles obtained in the above item (2) were mixed and adjusted to a viscosity of 250 cp while being added with butyl cellosolve in a homodisper stirrer, which was kneaded through triple roll mill to obtain a solution of a photo-sensitive resin composition.

(4) The solution of the photo-sensitive resin composition obtained in the above item (3) was applied to the printed board obtained in the above item (1) with a knife coater, and left to stand at a horizontal state for 20 minutes, and dried at 70° C. to form a photo-sensitive resin layer having a thickness of about 50 micrometers thereon.

(5) A photomask film printing a black circle of 100 micrometers in diameter was closed to the printed board treated in the above item (4), which was exposed to a super-high pressure mercury lamp at 500 mj/cm². Then, it was developed with a chlorocene solution under ultrasonic wave to form an opening of 100 micrometers in diameter as a via hole onto the printed board. Then, the printed board is exposed to a super-high pressure mercury lamp at about 3000 mj/cm², and then heated at 100° C. for 1 hour and further at 150° C. for 3 hours to form an interlaminar resin insulating layer 3 having the opening with an excellent size accuracy corresponding to the photomask film as shown in FIG. 1*b*.

(6) The printed board obtained in the above item (5) was immersed in an oxidizing agent composed of an aqueous solution of 500 g/liter of chromic acid ($Cr_2O_3$) at 70° C. for 15 minutes to roughen the surface of interlaminar resin insulating layer 3 into a state shown by 4(*a*) in FIG. 1*b*, and then immersed in a neutral solution (made by Shipley, PN-950) and washed with water.

To the substrate provided with the roughened interlaminar resin insulating layer was applied a paradium catalyst (made by Shipley, Cataposit 44) to activate the surface of the insulating layer, which was immersed in an electroless copper plating solution having a composition as shown in the following Table 1 for 11 hours to form an electroless copper plated film 5 of 25 micrometers in thickness as shown in FIG. 1*c*.

TABLE 1

| Copper sulfate | 0.06 mol/liter |
| Formalin (37%) | 0.30 mol/liter |
| Sodium hydroxide | 0.35 mol/liter |
| EDTA | 0.35 mol/liter |
| Additive | slight |
| Plating temperature | 70–72° C. |
| H = | 12.4 |

(7) After the steps of the items (1)–(6) were repeated two times, the step of the item (1) was further performed to produce a multilayer build-up printed circuit board having four circuit layers 1, 5, 6, 7 as shown in FIG. 1*d*.

EXAMPLE 2

(1) epoxy resin particles (made by Toray, Toraypeal EP-B, average particle size: 0.5 micrometers) were placed in a hot air dryer and agglomerated by heating at 180° C. for 3 hours. The thus agglomerated epoxy resin particles were dispersed into acetone, pulverized in a ball mill for 5 hours, sieved through an air siever to form agglomerate particles. The agglomerate particles had an average particle size of about 3.5 micrometers, wherein about 68% by weight of the particles was existent within a range of ±2 micrometers of the above average particle size.

(2) Fifty parts by weight of 75% acrylated product of cresol novolak type epoxy resin (made by Nihon Kayaku, trade name: EOCN-103S), 50 parts by weight of bisphenol A type epoxy resin (made by Dow Chemicals, trade name: DER661), 25 parts by weight of dipentaerythritol hexaacrylate, 5 parts by weight of benzylalkyl ketal (made by Ciba Geigy, trade name: Irgacure 651), 6 parts by weight of imidazole (made by Shikoku Kasei, trade name: 2P4MHZ) and 50 parts by weight of the agglomerate particles obtained in the above item (1) were mixed and adjusted to a viscosity of 250 cp while being added with butyl cellosolve in a homodisper stirrer, which was then kneaded through triple roll mill to prepare a solution of a light-sensitive resin composition.

(3) The solution of the photo-sensitive resin composition obtained in the above item (2) was applied to the printed board obtained in the item (1) of Example 1 (FIG. 2*a*) through a knife coater, left to stand at a horizontal state for 20 minutes and then dried at 70° C. to form a photo-sensitive resin insulating layer of about 50 micrometers in thickness.

(4) The step (5) of Example 1 was repeated to form an interlaminar resin insulating layer 3 having an opening as shown in FIG. 2*b*.

(5) The step (6) of Example 1 was repeated to roughen the surface of the interlaminar resin insulating layer as shown by 4(*b*) in FIG. 2*b*, and then electroless copper plating was conducted as shown in FIG. 2*c*.

(6) After the step (1) of Example 1 and the above items (1)–(5) were repeated two times, the step (1) of Example 1 was further conducted to obtain a multilayer build-up printed circuit board having four circuit layers 1, 5, 6, 7 as shown in FIG. 2*d*.

EXAMPLE 3

(1) One hundred parts by weight of 50% acrylated product of phenol aralkyl type epoxy resin, 4 parts by weight of 2-methyl-1-[4-(methylthio) phenyl]-2-morpholinopropane-1 (made by Ciba Geigy, trade name: Irgacure 907), 4 parts by weight of imidazole curing agent (made by Shikoku Kasei, trade name: 2P4MHZ), 10 parts by weight of epoxy resin powder having a large particle size (made by Toray, Toraypeal EP-B, average particle size: 3.9 micrometers) and 25 parts by weight of epoxy resin powder having a small particle size (made by Toray, Toraypeal EP-B, average particle size: 0.5 micrometers) were mixed with butylcarbitol to adjust a viscosity to 250 cp in a homodisper dispersing machine, which was then kneaded through triple roll mill to prepare a solution of a photo-sensitive resin composition.

(2) The solution of the photo-sensitive resin composition obtained in the above item (1) was applied to the printed board obtained in the item (1) of Example 1 (FIG. 3*a*) through a knife coater, left to stand at a horizontal state for 20 minutes and then dried at 70° C. to form a photo-sensitive resin insulating layer of about 50 micrometers in thickness.

(3) The step (5) of Example 1 was repeated to form an interlaminar resin insulating layer 3 having an opening as shown in FIG. 3*b*.

(4) The step (6) of Example 1 was repeated to roughen the surface of the interlaminar resin insulating layer as shown by 4(*c*) in FIG. 3*b*, and then electroless copper plating was conducted as shown in FIG. 3*c*.

(5) After the step (1) of Example 1 and the above items (1)–(4) were repeated two times, the step (1) of Example 1 was further conducted to obtain a multilayer build-up printed circuit board having four circuit layers 1, 5, 6, 7 as shown in FIG. 3*d*.

EXAMPLE 4

(1) Sixty parts by weight of 70% acrylated products of phenol novolak type epoxy resin (made by Yuka Shell, trade name: E-154), 40 parts by weight of bisphenol A type epoxy resin (made by Yuka Shell, trade name: E-1000), 4 parts by weight of imidazole curing agent (made by Shikoku Kasei, trade name: 2P4MHZ), 10 parts by weight of epoxy resin powder having a large particle size (made by Toray, trade name: Toraypeal EP-B, average particle size: 3.9 micrometers) and 25 parts by weight of epoxy resin powder having a small particle size (made by Toray, trade name: Toraypeal EP-B, average particle size 0.5 micrometers) were mixed with butylcarbitol to adjust a viscosity to 250 cp in a homodisper dispersing machine, which was then kneaded through triple roll mill to prepare a solution of a photo-sensitive resin composition.

Figure 4B:
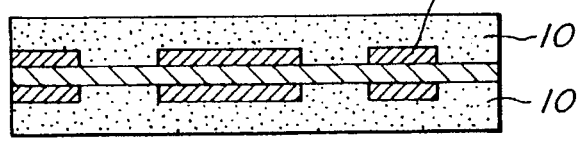

(2) To a printed board obtained by photo-etching a surface copper foil 9 of glass-epoxy laminated plate 8 provided at both surfaces with copper according to the usual manner as shown in FIG. 4*a* was applied the solution of the adhesive obtained in the above item (1) through a roll coater, which was then dried and cured at 100° C. for 1 hour and further at 150° C. for 5 hours to form a resin insulating layer 10 as shown in FIG. 4*b*.

Figure 4C:
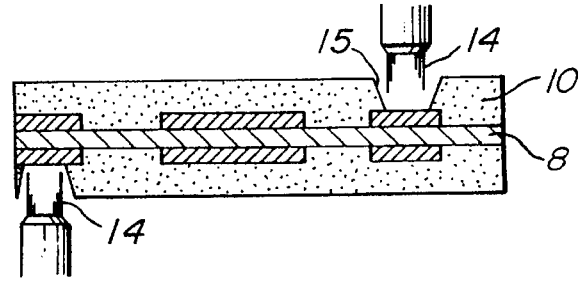

(3) This substrate was exposed to $CO_2$ laser 14 to form an opening 15 in the resin insulating layer as shown in FIG. 4*c*.

Figures 4D, 4G:
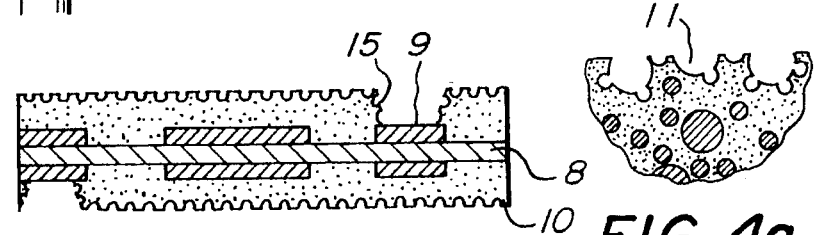

(4) The substrate was immersed in chromic acid for 10 minutes to roughen the resin surface as shown by 11 in FIG. 4*d*, neutralized and washed with water.

Figure 4E:
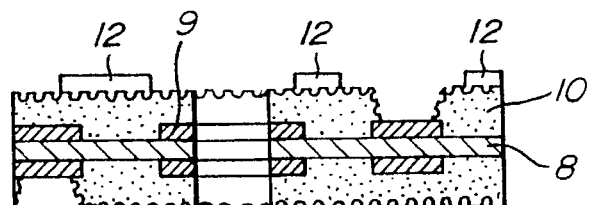

(5) A through-hole was formed in the usual manner as shown in FIG. 4*e*.

(6) A paradium catalyst (made by Play, Cataposit 44) was applied to the substrate to activate the surface of the resin insulating layer.

(7) After a photo-sensitive dry film (made by San Nopc, trade name: DFR-40C) was laminated onto the printed board, the conductor pattern was exposed to light and developed.

Figure 4F:
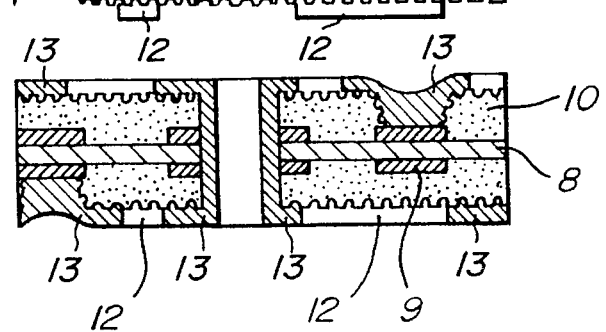

(8) It was immersed into an electroless copper plating solution shown in Table 1 for 11 hours to form an electroless copper plated film 13 of 25 micrometers in thickness, whereby a multilayer printed circuit board was manufactured as shown in FIG. 4*f*.

EXAMPLE 5

The same procedure as in Example 4 was repeated except that after the surface roughening of the insulating layer was carried out by using chromic acid as shown in FIG. 5*c*, $CO_2$ laser was irradiated to form an opening in the insulating layer as shown in FIG. 5*d*, whereby a multilayer printed circuit board was manufactured as shown in FIG. 5*f*.

EXAMPLE 6

(1) To the adhesive obtained in the item (1) of Example 4 was added 5% by weight of PhSi(OEt)$_3$, (made by Toshiba Silicon, trade name: TSL8178) as a coupling agent, which was added with butylcarbitol to adjust a viscosity to 120 cp.

(2) The thus obtained adhesive was impregnated into a glass woven fabric and dried at 130° C. for 10 minutes to obtain a prepreg having a resin content of 40% by weight.

(3) The prepreg obtained in the above item (2) was laminated onto a printed board obtained by photo-etching a surafce copper foil of glass-epoxy laminated plate provided at both surfaces with copper and pressed at 170° C. under a pressure of 40 kgf/cm².

(4) The same steps (3)–(8) as in Example 4 were repeated to obtain a multilayer printed circuit board.

The adhesion strength between the insulating layer and the electroless plated film was measured with respect to the above multilayer printed circuit boards according to a method of JIS C6481 to obtain results as shown in the following Table 2.

TABLE 2

| | Peeling strength (kgf/cm) |
|---|---|
| Example 1 | 1.86 |
| Example 2 | 1.91 |
| Example 3 | 1.85 |
| Example 4 | 1.80 |
| Example 5 | 1.80 |
| Example 6 | 1.86 |

As mentioned above, according to the invention, adhesives for electroless plating having very excellent thermal resistance, electrical insulating property, chemical stability and adhesion property to electroless plated film can be provided. Further, the printed circuit boards using-this adhesive are very excellent in the adhesion property between the conductor circuit pattern composed of the electroless plated film and the insulating layer and have a complicated wiring pattern and are suitable for high densification and high speed fabrication. Therefore, the invention is very large in the industrial contribution.

What is claimed is:

1. An adhesive suitable for use in electroless plating used in connection with printed circuit broads, comprising:
    (a) a heat-resistant resin which is slightly soluble in the presence of an oxidizing agent;
    (b) a plurality of heat-resistant particles which are easily soluble in said oxidizing agent when dispersed in said heat-resistant resin, said heat-resistant particles being selected from the group consisting of (1) quasi particles obtained by adhering at least one of heat-resistant resin fine powders having an average particle size of not more than 2 μm and inorganic fine powders having an average particle size of not more than 2 μm to surfaces of heat-resistant particles having an average particle size of 2–10 μm through heating or with a binder, and (2) agglomerated particles obtained by agglomerating heat-resistant resin fine powders having an average particle size of not more than 2 μm into an average particle size of 2–10 μm, through heating or with a binder and then sieving them, and mixtures thereof.

2. The adhesive according to claim 1, wherein said heat-resistant resin which is lightly soluble in the presence of an oxidizing agent comprises a photo-sensitive resin.

3. The adhesive according to claim 1, wherein said heat-resistant particles are present in an amount of 5–350 parts by weight per 100 parts by weight as a solid content of said heat-resistant resin.

4. The adhesive according to claim 3, wherein said heat-resistant particles are present in an amount of 5–200 parts by weight per 100 parts by weight as a solid content of said heat-resistant resin.

5. The adhesive according to claim 1, wherein said oxidizing agent is selected from the group consisting of chromic acid, chromate, permanganate and ozone.

6. The adhesive according to claim 1, wherein said heat-resistant resin comprises a liquid.

7. A fibrous material having the adhesive according to claim 1 as a film or a prepreg impregnated therein.

8. The adhesive according to claim 1, wherein said heat-resistant resin which is lightly soluble in the presence of an oxidizing agent comprises an epoxy resin.

9. The adhesive according to claim 1, wherein said heat-resistant resin which is lightly soluble in the presence of an oxidizing agent comprises an epoxy-modified polyamide resin.

10. The adhesive according to claim 1, wherein said heat-resistant resin which is lightly soluble in the presence of an oxidizing agent comprises a polyamide resin.

11. The adhesive according to claim 1, wherein said heat-resistant resin which is lightly soluble in the presence of an oxidizing agent comprises a phenolic resin.

* * * * *